United States Patent
Tran et al.

(10) Patent No.: US 7,196,957 B2
(45) Date of Patent: Mar. 27, 2007

(54) MAGNETIC MEMORY STRUCTURE USING HEATER LINES TO ASSIST IN WRITING OPERATIONS

(75) Inventors: Lung Tran, Saratoga, CA (US); Thomas C. Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 56 days.

(21) Appl. No.: 11/105,054

(22) Filed: Apr. 13, 2005

(65) Prior Publication Data

US 2005/0185453 A1 Aug. 25, 2005

Related U.S. Application Data

(62) Division of application No. 10/624,175, filed on Jul. 22, 2003, now Pat. No. 6,906,941.

(51) Int. Cl.
*G11C 7/04* (2006.01)

(52) U.S. Cl. .................... 365/213; 365/66; 365/171; 365/214

(58) Field of Classification Search ................ 365/63, 365/66 X, 171 X, 174, 189.08, 213 O, 214 X, 365/230.06
See application file for complete search history.

(56) References Cited

U.S. PATENT DOCUMENTS

| 4,424,578 | A | * | 1/1984 | Miyamoto ................ 365/104 |
| 6,404,674 | B1 | | 6/2002 | Anthony et al. |
| 6,535,416 | B1 | * | 3/2003 | Daughton et al. .......... 365/145 |
| 6,603,678 | B2 | * | 8/2003 | Nickel et al. .............. 365/171 |

* cited by examiner

*Primary Examiner*—VanThu Nguyen (57) ABSTRACT

The invention includes a stacked magnetic memory structure. The magnetic memory structure includes a stacked magnetic memory structure. The first layer includes a first plurality of magnetic tunnel junctions. A second layer is formed adjacent to the first layer. The second layer includes a second plurality of magnetic tunnel junctions. The stacked magnetic memory structure further includes a common first group conductor connected to each of the first plurality of magnetic tunnel junctions and the second plurality of magnetic tunnel junctions.

12 Claims, 10 Drawing Sheets

MAGNETIC MEMORY STRUCTURE USING HEATER LINES TO ASSIST IN WRITING OPERATIONS

RELATED APPLICATIONS

This is a divisional of Ser. No. 10/624,175, filed on Jul. 22, 2003 U.S. Pat. No. 6,906,941, titled "Magnetic Memory Structure, issued Jun. 14, 2005.

FIELD OF THE INVENTION

The invention relates generally to electronic memory. More particularly, the invention relates to a stacked magnetic memory structure.

BACKGROUND OF THE INVENTION

Non-volatile memory is memory that retains its content (data) even when power connected to the memory is turned off. Magnetic random access memory (MRAM) is a type of non-volatile memory. MRAM includes storing a logical state, or bit, by setting magnetic field orientations of MRAM cells within the MRAM. The magnetic field orientations remain even when power to the MRAM cells is turned off.

Figure 1:
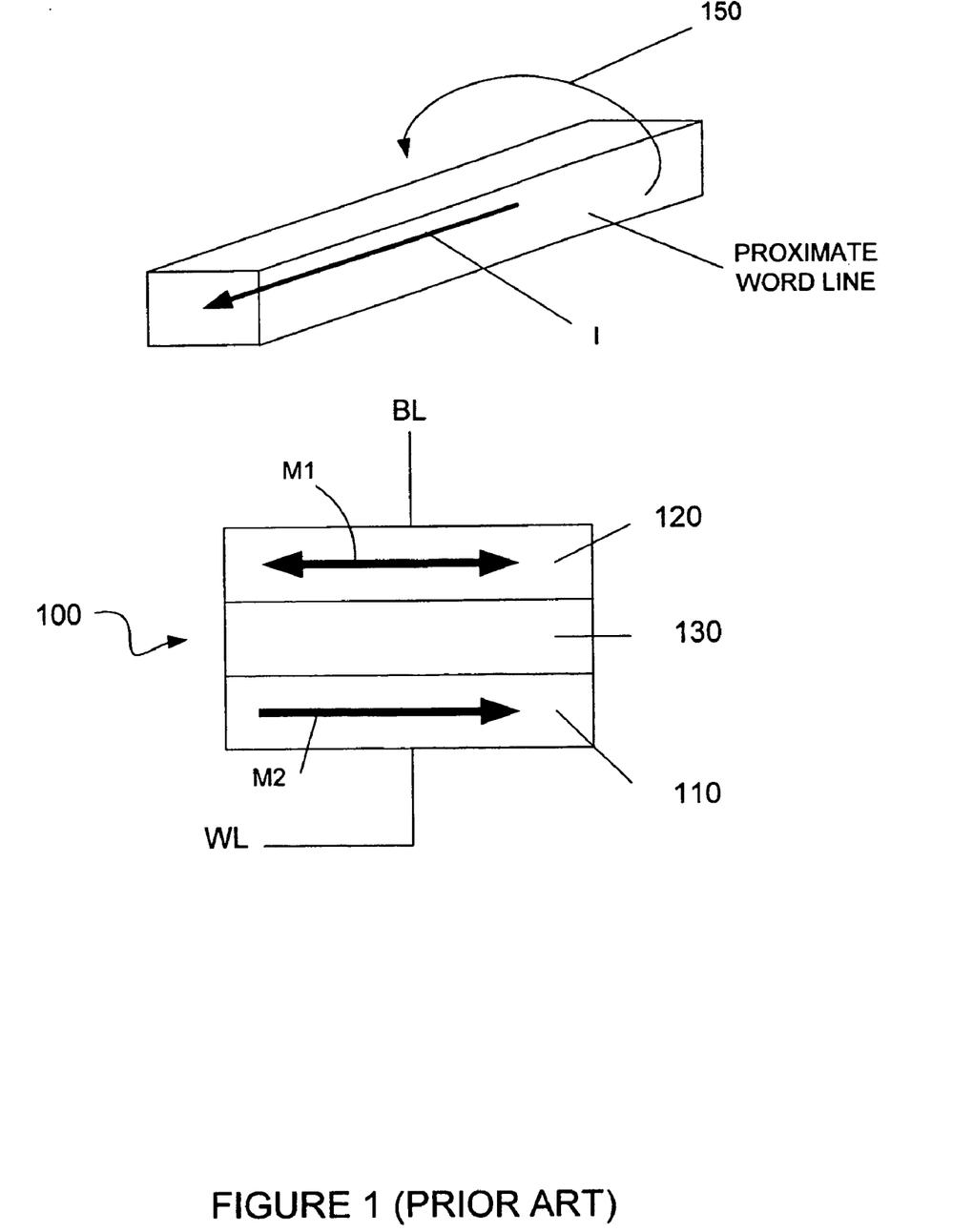
FIG. 1 shows a prior art MRAM memory cell.

FIG. 1 shows an MRAM cell 100. The MRAM memory cell 100 includes a soft magnetic region 120, a dielectric region 130 and a hard magnetic region 110. The orientation of magnetization within the soft magnetic region 120 is non-fixed, and can assume two stable orientations as shown by the arrow M1. The hard magnetic region 110 (also referred to as a pinned magnetic region) has a fixed magnetic orientation as depicted by the arrow M2. The dielectric region 130 generally provides electrical insulation between the soft magnetic region 120 and the hard magnetic region 110.

The MRAM memory cell generally is located proximate to a crossing point of a word line (WL) and a bit line (BL). The word line and the bit line can be used for setting the magnetic state of the memory cell, or for sensing an existing magnetic state of the memory cell. FIG. 1 also includes a proximate word line that can also be used to set the magnetic state of the MRAM memory cell 100. A magnetic field as depicted by the arrow 150 can be induced by a current 1 flowing through the proximate word line. The induced magnetic field can set the magnetic state of the MRAM memory cell 100.

As previously stated, the orientation of magnetization of the soft magnetic region 120 can assume two stable orientations. These two orientations, which are either parallel or anti-parallel to the magnetic orientation of the hard magnetic region 110, determine the logical state of the MRAM memory cell 100. The soft magnetic region 120 is generally referred to as the sense or data layer, and the hard magnetic region 110 is generally referred to as the reference layer.

The magnetic orientations of the MRAM memory cells can be set (written to) by controlling electrical currents flowing through the word lines and the bit lines, and therefore, by the corresponding magnetic fields induced by the electrical currents. Because the word line and the bit line operate in combination to switch the orientation of magnetization of the selected memory cell (that is, to write to the memory cell), the word line and the bit line can be collectively referred to as write lines. Additionally, the write lines can also be used to read the logic value stored in the memory cells. The electrical currents applied to the bit line and the word line set the orientation of the magnetization of the data layer depending upon the directions of the currents flowing through the bit line and the word line, and therefore, the directions of the induced magnetic fields created by the currents flowing through the bit line and the word line.

The MRAM memory cells are read by sensing a resistance across the MRAM memory cells. The resistance is sensed through the word lines and the bit lines. Generally, the logical state (for example, a "0" or a "1") of a magnetic memory cell depends on the relative orientations of magnetization in the data layer and the reference layer. For example, in a tunneling magneto-resistance memory cell (a tunnel junction memory cell), when an electrical potential bias is applied across the data layer and the reference layer, electrons migrate between the data layer and the reference layer through the intermediate layer (a thin dielectric layer typically called the tunnel barrier layer). The migration of electrons through the barrier layer may be referred to as quantum mechanical tunneling or spin tunneling. The logic state can be determined by measuring the resistance of the memory cell. For example, the magnetic memory cell is in a state of low resistance if the overall orientation of the magnetization in its data storage layer is parallel to the pinned orientation of magnetization of the reference layer. Conversely, the tunneling junction memory cell is in a high resistance if the overall orientation of magnetization in its data storage layer is anti-parallel to the pinned orientation of magnetization of the reference layer. As mentioned, the logic state of a bit stored in a magnetic memory cell is written by applying external magnetic fields that alter the overall orientation of magnetization of the data layer. The external magnetic fields may be referred to as switching fields that switch the magnetic memory cells between high and low resistance states.

Figure 2:
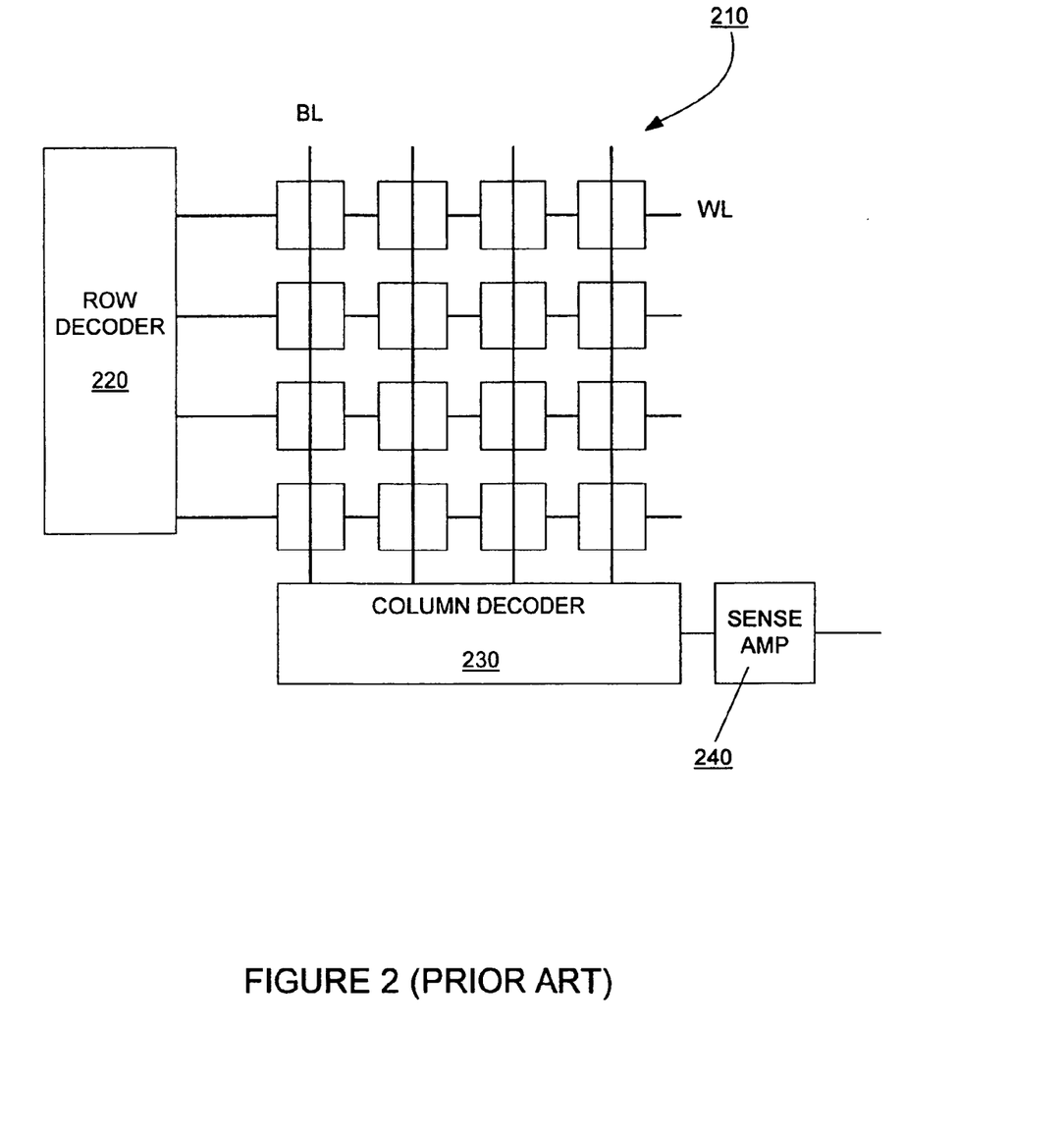
FIG. 2 shows an array of MRAM memory cells.

FIG. 2 shows an array 210 of MRAM memory cells. The logical states of each of the MRAM memory cells can be magnetically set by externally applied magnetic fields through bit lines (BL) and word lines (WL). Generally, the bit line and word line selections are made through a row decoder 220 and a column decoder 230. The logical states of the memory cells are determined by a sense amplifier 240.

The array 210 of MRAM memory cells can suffer from half-select errors when writing to the memory cells. Memory cells are selected by selecting a particular bit line (BL), and selecting a particular word line (WL). A half-select error occurs when a memory cell associated with a selected bit line and a non-selected word line changes states, or when a memory cell associated with a non-selected bit line and a selected word line changes states. Clearly, half-select errors degrade the performance of MRAM memory.

It is desirable to minimize half-select errors of MRAM memory cells. Additionally, it is desirable that MRAM memory be dense, and dissipate low power.

SUMMARY OF THE INVENTION

The invention includes an apparatus and method for stacked magnetic tunnel junction memory cells. The apparatus and method provide for reduced half-select errors. Additionally, the stacked magnetic junction memory is dense, and dissipates low power.

An embodiment of the invention includes a stacked magnetic memory structure. The magnetic memory structure includes a first. The first layer includes a first plurality of magnetic tunnel junctions. A second layer is formed adjacent to the first layer. The second layer includes a second plurality of magnetic tunnel junctions. The stacked magnetic memory structure further includes a common first group conductor connected to each of the first plurality of magnetic tunnel junctions and the second plurality of magnetic tunnel junctions.

Other aspects and advantages of the present invention will become apparent from the following detailed description, taken in conjunction with the accompanying drawings, illustrating by way of example the principles of the invention.

BRIEF DESCRIPTION OF THE INVENTION

DETAILED DESCRIPTION

As shown in the drawings for purposes of illustration, the invention is embodied in an apparatus and method for stacked magnetic tunnel junction memory cells. The apparatus and method provide for reduced half-select errors. Additionally, the stacked magnetic junction memory is dense, and dissipates low power.

Figure 3:
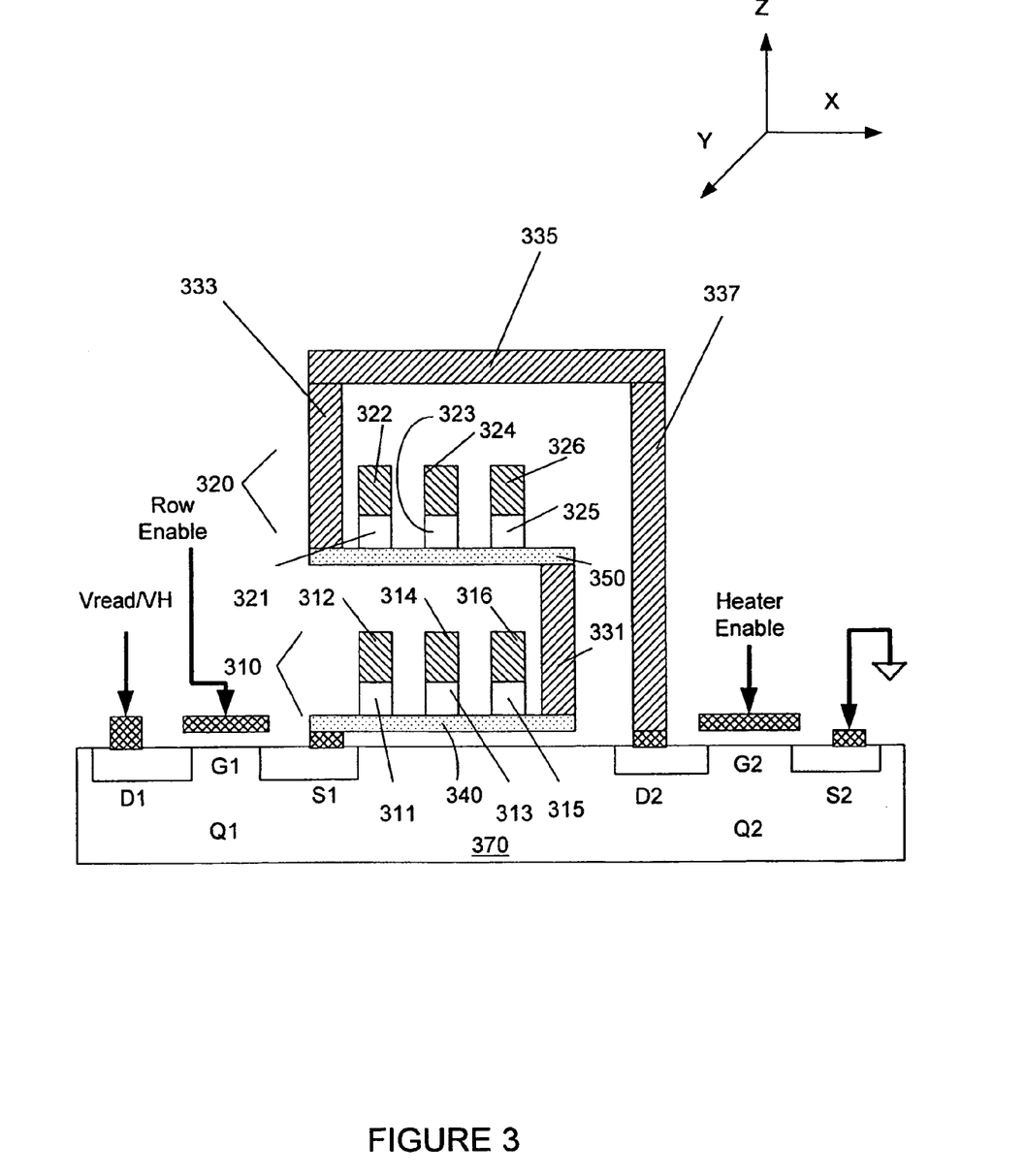
FIG. 3 shows a stacked memory structure according to an embodiment of the invention.

FIG. 3 shows a stacked magnetic memory structure according to an embodiment of the invention. As will be described, this embodiment includes two layers of magnetic memory cells. However, the invention can include any number of layers of stacked memory cells. Additionally, additional conductors can be placed proximate to the magnetic memory cells to aid in writing to the magnetic memory cells. The additional conductors are not shown in FIG. 3.

A first layer 310 is formed adjacent to a substrate 370. The first layer 310 includes a first plurality of magnetic tunnel junctions 311, 313, 315. Each of the first plurality of magnetic tunnel junctions 311, 313, 315 is electrically (and thermally) connected to a first group conductor. As shown in FIG. 3, the first group conductor includes segments 340, 331, 350, 333, 335, 337. As will be described, an embodiment includes segment 340 and segment 350 being conductors. Another embodiment includes segment 340 and segment 350 being heater elements. Each of the first plurality of magnetic tunnel junctions is also electrically connected to corresponding first select conductive lines 312, 314, 316. The first select conductive lines 312, 314, 316 can be column select conductive lines.

Another embodiment include the segment 340, 350 being additionally segmented. The segments 340, 350 can include both conductive regions, and heater regions. The heater regions of the segments 340, 350 can be located proximate to each of the magnetic tunnel junctions 311, 313, 315. The heater regions can include a material that is more resistive than the conductive regions.

Writing to a particular magnetic tunnel junction generally requires current to be conducted through a corresponding first select conductive line, and first group conductor. For example, writing to a first magnetic tunnel junction 311, generally requires current to be conducted through a first select conductive line 312 and the first group conductor. The current conducted through the first select conductive line 312 generates a magnetic field (Hx as described later) having a first orientation with respect to the magnetic tunnel junction, and the current conducted through the first conductor generates a magnetic field (Hy as described later) having a second orientation with respect to the magnetic tunnel junction. If segment 340 is a first heater rather than a conductor, then the two magnetic fields, in combination with the first heater 340, set the magnetic orientation of the magnetic tunnel junction.

Reading from a magnetic tunnel junction requires an electrical connection between each of the two terminals of the magnetic tunnel junctions. Reading a magnetic tunnel junction require sensing a resistance of the magnetic tunnel junction.

The first heater 340 provides thermal heat to the first plurality of magnetic tunnel junctions 311, 313, 315. As will be described later, heating the magnetic tunnel junctions 311, 313, 315 reduces the magnitude of the write current required to set magnetic orientations of the magnetic tunnel junctions 311, 313, 315. The heater only reduces the required write current of magnetic tunnel junctions that are proximate to the heater. Therefore, half-select errors of magnetic tunnel junctions that are not proximate can be reduced, because a smaller magnitude write current can be applied to the magnetic tunnel junctions that are proximate to the heater.

As shown in FIG. 3, a second layer 320 of magnetic memory cells is formed over the first layer 310 of magnetic memory cells. The second layer 320 includes a second plurality of magnetic tunnel junction sensors 321, 323, 325.

The stacked magnetic memory structure of FIG. 3 can further include a second heater 350 formed adjacent to the second plurality of magnetic tunnel junctions 321, 323, 325. The second heater 350 provides thermal heat to the second plurality of magnetic tunnel junctions 321, 323, 325. Generally (but not required), the second heater 350 is thermally isolated from the first plurality of magnetic tunnel junctions 321, 323, 325. As will be described later, heating the magnetic tunnel junctions 321, 323, 325 reduces the magnitude of the write current required to set magnetic orientations of the magnetic tunnel junctions 321, 323, 325.

As previously stated, writing to a particular magnetic tunnel junction generally requires current to be conducted through a corresponding first select conductive line, and the first group conductor. When the first group conductor includes heater elements, the current conducted through the first group conductor heats corresponding magnetic tunnel junctions, and generates a magnetic field that can be used to aid in writing to the magnetic tunnel junctions.

The substrate 370 can include a first select transistor Q1, and a second select transistor Q2. When both the first select transistor Q1 and the second select transistor Q2 are turned on, current is conducted through the first heater 340 and the second heater 350. Generally, the first select transistor Q1 and the second select transistor Q2 are both selected when writing to at least one of the magnetic tunnel junctions 311, 313, 315 of the first layer 310, or of the magnetic tunnel junctions 321, 323, 325 of the second layer 320. The first heater 340 and the second heater 350 only need to be turned on when writing to a magnetic tunnel junction. Reading a magnetic tunnel junction does not require a heater to be turned on.

An embodiment includes the second select transistor Q2 controlling enabling of the first and second heaters 340, 350. A Heater Enable control is connected to the gate (G2) of the second select transistor Q2, and turns the second select transistor Q2 on when the heaters 340, 350 are to be turned on. The source (S2) of the second select transistor Q2 is connected to ground, and the drain (D2) of the second select transistor Q2 is connected to the second heater 350 through conductive lines.

An embodiment includes the first select transistor Q1 providing row selection and heater control. A Row Enable control is connected to the gate (G1) of the first select transistor Q1. A Vread sense or a VH (voltage for the heaters) is connected to the drain (D1) of the first select transistor (Q1). The source (S1) of the first select transistor Q1 is connected to the first heater 340. A circuit schematic will be provided later to provide additional clarity of the electrical connection of the stacked magnetic tunnel junction structure.

Reading of at least one of the magnetic tunnel junctions 311, 313, 315 of the first layer 310, or of the magnetic tunnel junctions 321, 323, 325 of the second layer 320 only requires the first select transistor Q1 to be selected. The selected transistor can be used to sense a resistive state of a magnetic tunnel junction located between one of the conductive select lines 312, 314, 316, 322, 324, 326 and the selected transistor. As previously described, the resistive state of each magnetic tunnel junction determines the logical state of the magnetic tunnel junction.

Conductive lines 331, 333, 225, 337 provide electrical connections between the first heater 340, the second heater 350 and the select transistors Q1, Q2.

The substrate 370 can include any standard substrate material such as silicon.

Generally, the first and second heaters 340, 350 must provide thermal heat when current is conducted through the first and second heaters 340, 350. The first and second heaters 340, 350 can include tungsten or platinum. However, any material that provides the desired heating functionality can be used.

The conductive lines 312, 314, 316, 322, 324, 326, 331, 333, 335, 337 can include any generally accepted conductive material such as aluminum, copper or gold. An embodiment includes the conductive lines 331, 333, 335, 337 being formed from the same material as the heaters.

The magnetic tunnel junctions generally included a pinned (reference) layer, an insulating layer and a sense (data) layer. The pinned layer can include a single layer or material or multiple layers of material. For example, the pinned layer can include one or more ferromagnetic materials. Such materials can include nickel iron, nickel iron cobalt, cobalt iron, or other magnetic alloys of nickel iron and cobalt. The insulating layer can include aluminum oxide, silicon oxide, silicon nitride, tantalum oxide, and/or other insulating materials. The sense layer can include one or more ferromagnetic materials. Such materials can include nickel iron, nickel iron cobalt, cobalt iron, or other magnetic alloys of nickel iron and cobalt.

Alternate embodiments can include a single heater rather than the multiple heater structure of FIG. 3. For example, a single heater could be used to heat both the magnetic tunnel junctions of the first layer, and the magnetic tunnel junctions of the second layer. As previously stated, the invention can include more layers than two. For example, the magnetic tunnel junctions of the first layer can be formed just below a common first group conductor, and the magnetic tunnel junctions of the second layer can be formed just above the common first group conductor.

Figure 4:
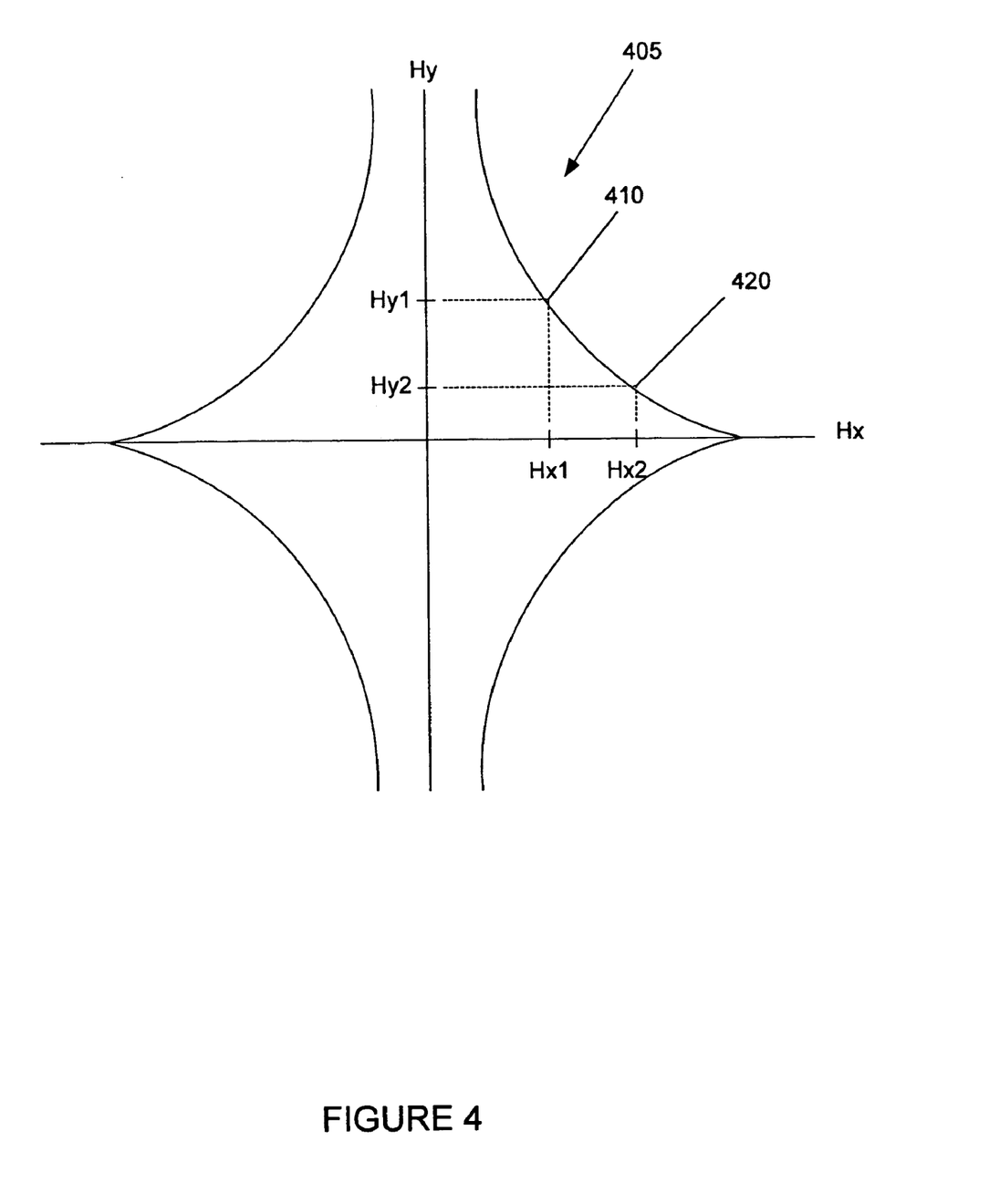
FIG. 4 is a plot showing an intensity of externally applied magnetic fields required to cause an MRAM memory cell to change states.

FIG. 4 is a plot showing an intensity of externally applied magnetic fields required to cause an magnetic tunnel junction memory cell to change states. A first axis is an Hx axis and a second axis is an Hy axis. A magnetic tunnel junction memory cell can generally be physically represented by an X-axis and a Y-axis. Generally, the X-axis of the described magnetic tunnel junction memory cells corresponds with the longest cross-sectional dimension of the magnetic tunnel junction memory cells. Generally, the longest cross-sectional dimension of the magnetic tunnel junction memory cells corresponds with the most stable magnetic orientation of the magnetic tunnel junction memory cells. Therefore, the X-axis of the magnetic tunnel junction memory cells is generally the most stable magnetic orientation of the magnetic tunnel junction memory cells. As a result, two stable magnetic orientations of the magnetic tunnel junction cells generally includes two magnetic orientations as defined by the X-axis of the memory cells.

FIG. 4 shows the magnetic field intensity required to "flip" or change the magnetic orientation of the soft magnetic region of the magnetic memory cell. For example, a first quadrant 405 of the plot of FIG. 4 shows the required Hx magnetic field to cause the MRAM memory cell to change magnetic states for various values of applied Hy magnetic field. A first switch point 410 suggests a first level Hx1 of required Hx magnetic field intensity to change the magnetic state of the memory cell for a first level Hy1 of Hy magnetic filed intensity. A second switch point 420 suggests a second level Hx2 of required Hx magnetic field intensity to change the magnetic state of the memory cell for a second level Hy2 of Hy magnetic filed intensity. The required Hx2 magnetic field intensity of the second switch point 420 is greater than the required Hx1 magnetic field intensity of the first switch point 410.

Figure 5:
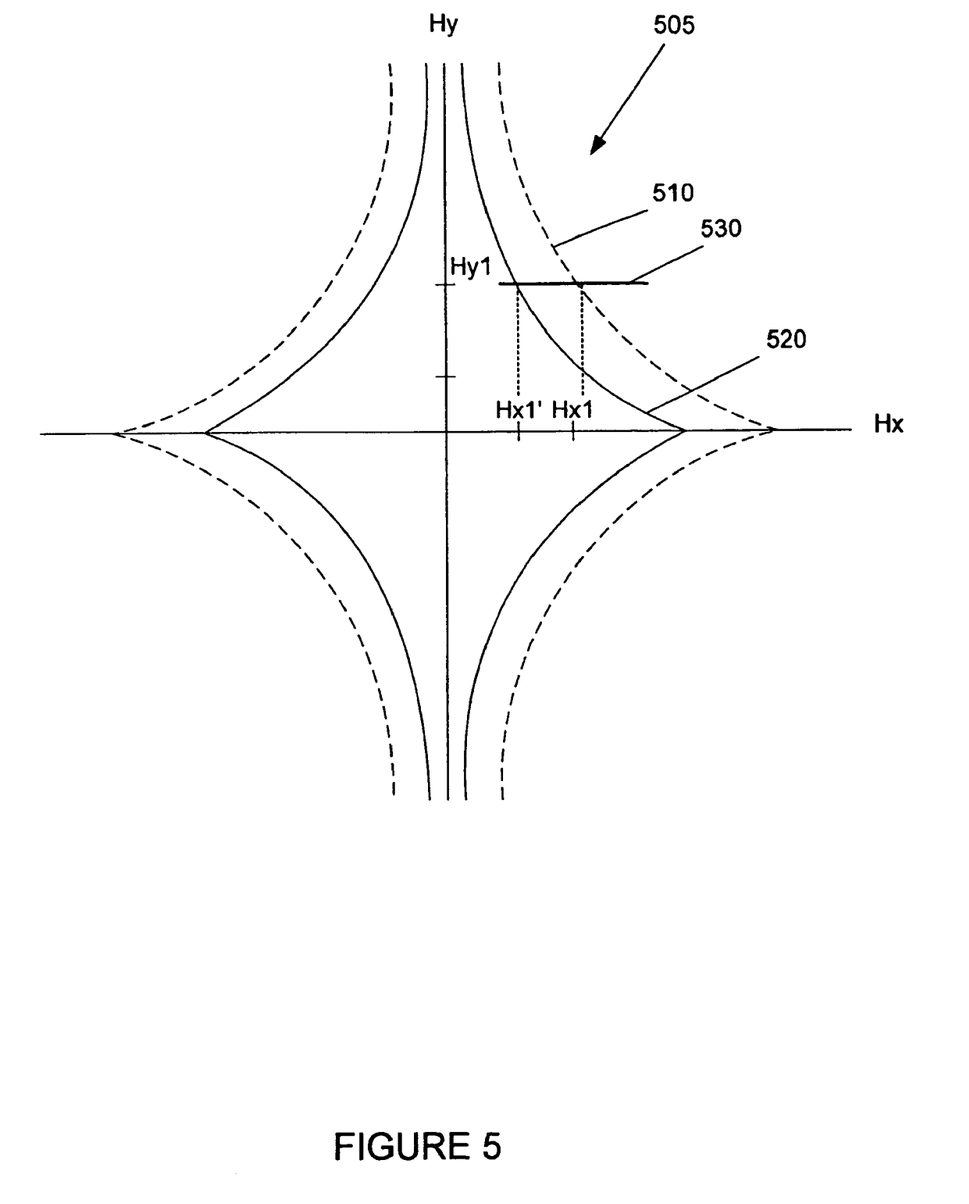
FIG. 5 is a plot showing an intensity of externally applied magnetic fields required to cause an MRAM memory cell to change states, for two different MRAM cell temperatures.

FIG. 5 is a plot showing an intensity of externally applied magnetic fields required to cause an MRAM memory cell to change states, for two different MRAM cell temperatures. A first curve 510 represents the magnetic field intensity required to change or flip the magnetic orientation of a magnetic tunnel junction for a first temperature. A second curve 520 represents the magnetic field intensity required to change of flip the magnetic orientation of a magnetic tunnel junction for a second temperature.

The effect of temperature on the ability to change to the state of the magnetic tunnel junction can be observed by observing the required Hx magnetic field required to change the state of the magnetic tunnel junctions for a fixed Hy magnetic field as depicted by line 530. As depicted by line 520, for a fixed Hy magnetic field of Hy1, the required Hx magnetic field intensity is Hx1 for the first temperature, and the required Hx magnetic field intensity is Hx1' for the second temperature. Hx1' is less than Hx1 when the second temperature is greater than the first temperature.

The first temperature is generally less than the second temperature. Therefore, the magnetic field intensity required to change or flip the state of the magnetic tunnel junction is less for a greater temperature. This suggests that activating a heater proximate to a magnetic tunnel junction reduces the amount of write current required to change or flip the magnetic orientation of the magnetic tunnel junction.

For the stacked magnetic tunnel junction of FIG. 3, the magnetic tunnel junctions that include a heater that is "turned on", require a smaller magnitude of write current to change or flip the magnetic state of the magnetic tunnel junctions. Magnetic tunnel junctions that include a heater that is not "turned on", require a greater magnitude of write current to change of flip the magnetic state of the magnetic tunnel junctions. Therefore, non-selected magnetic tunnel junctions that include non-selected heaters are less likely to suffer from half-select errors.

The Hx field shown and described in FIGS. 4 and 5 can be produced by current conducting through the conductors 312, 314, 316, 322, 324, 326. The Hy field shown and described in FIG. 4 and 5 can be produced by current conducting through the conductors (heaters) 340, 350.

Figure 6:
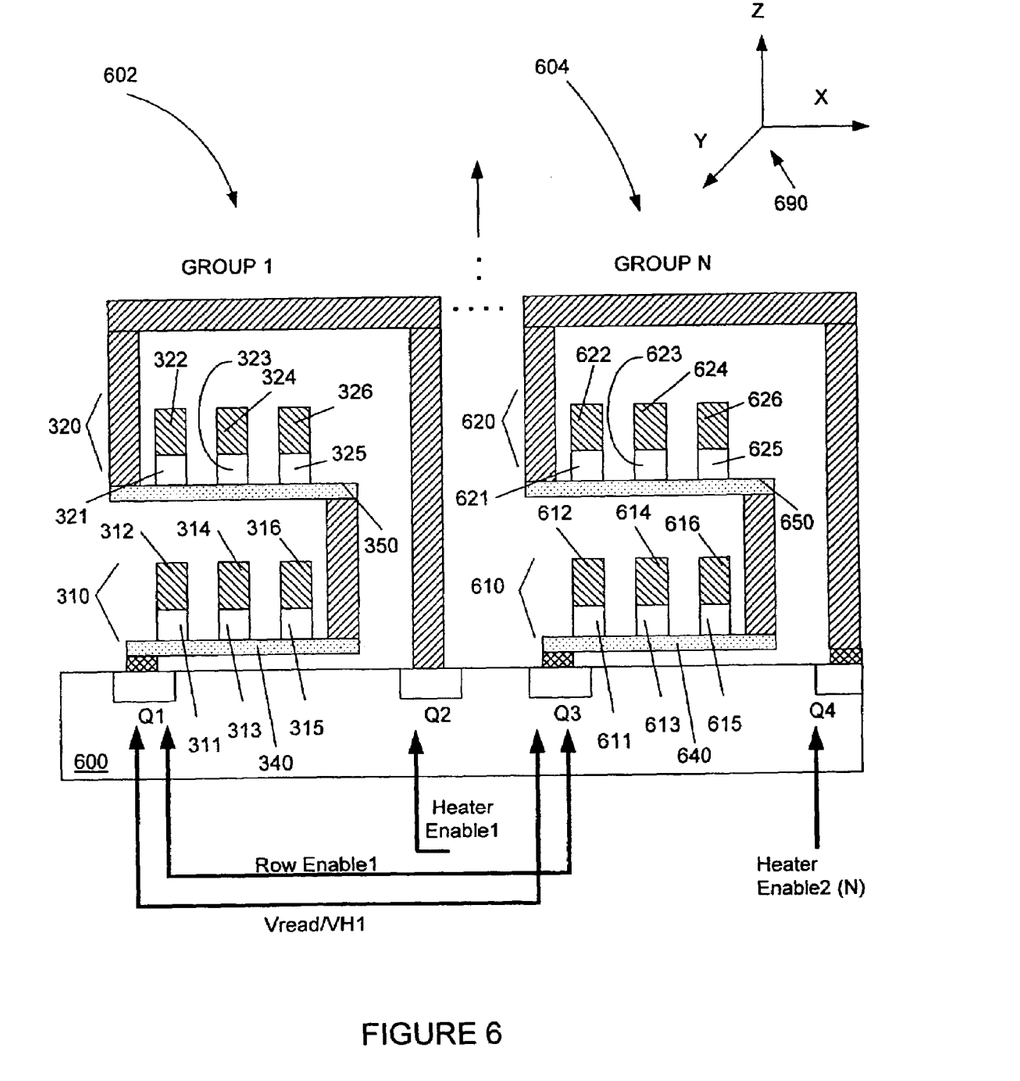
FIG. 6 shows a stacked memory structure according to another embodiment of the invention.

FIG. 6 shows a stacked memory structure according to another embodiment of the invention. This embodiment includes two separate groups of magnetic tunnel junctions 602, 604. Generally, only a single one of the two groups (or more) of magnetic tunnel junctions 602, 604 are selected at a time.

In FIG. 6, the first group is designated as GROUP1. The second group is designated as GROUP N, to represent that the embodiment can include a row that includes N groups of stacked magnetic tunnel junctions. Additionally, the rows can be repeated to form an array of stacked magnetic tunnel junctions. The array includes rows and columns of stacked magnetic tunnel junctions.

The first group of magnetic tunnel junction 602 includes an embodiment similar to the embodiment of FIG. 3. The embodiment of FIG. 3 has been included within FIG. 6, and the common reference designators have been included.

Rows and columns of stacked magnetic tunnel junctions can be selected. Within a row, particular groups of stacked magnetic tunnel junctions can be selected. For example, as shown in FIG. 6 magnetic tunnel junction selections can include selecting either the first group 602 or the second group (N) 604. The selection can be made through selection of the selection transistors Q1, Q2, Q3, Q4. The control lines of the selection transistors Q1, Q2 of the first group 602 have been modified to Vread/VH1, Row Enable1 and Heater Enable1 to allow differentiation from the control lines of the other groups of stacked magnetic tunnel junctions as will be described in FIG. 8. The Vread/VH1 and Row Enable1 control line can be used for the second group (N) 604 because the second group 604 is located within the same row as the first group 602. The second group 604 includes a separate Heater Enable2 control line. The sources, gates and drains of the control transistors Q1, Q2, Q3, Q4 are not shown in FIG. 6, but the physical characteristics of the control transistors Q1, Q2, Q3, Q4 are as described in FIG. 3.

The second group of magnetic tunnel junctions 604 includes a second group first layer 610 that is formed adjacent to the substrate 670. The second group first layer 610 includes a third plurality of magnetic tunnel junctions 611, 613, 615. Each of the third plurality of magnetic tunnel junctions 611, 613, 615 is electrically (and thermally) connected to a third heater 640 (alternatively, a second group conductor including segments 640, 650). Each of the third plurality of magnetic tunnel junctions is also electrically connected to corresponding third select conductive lines 612, 614, 616. The third select conductive lines 612, 614, 616 can be column select conductive lines.

Writing to a particular magnetic tunnel junction generally requires current to be conducted through a corresponding third select conductive line, and a corresponding heater. For example, writing to a third magnetic tunnel junction 611, generally requires current to be conducted through a third select conductive line 612 and the third heater 640. The current conducted through the third select conductive line 612 generates a magnetic field (Hx as described in FIGS. 4 and 5) having a first orientation with respect to the magnetic tunnel junction, and the current conducted through the heater (second group conductor) generates a magnetic field (Hy as described in FIGS. 4 and 5) having a second orientation with respect to the magnetic tunnel junction. The combination of the two magnetic fields set the magnetic orientation of the magnetic tunnel junction.

The third heater 640 provides thermal heat to the third plurality of magnetic tunnel junctions 611, 613, 615. As was described earlier (FIG. 5), heating the magnetic tunnel junctions 611, 613, 615 reduces the magnitude of the write current required to set magnetic orientations of the magnetic tunnel junctions 611, 613, 615. The heater only reduces the required write current of magnetic tunnel junctions that are proximate to the heater. Therefore, half-select errors of magnetic tunnel junctions that are not proximate can be reduced, because a smaller magnitude write current can be applied to the magnetic tunnel junctions that are proximate to the heater.

As shown in FIG. 6, a second group second layer 620 of magnetic memory cells is formed over the second group first layer 610 of magnetic memory cells. The second group second layer 620 includes a fourth plurality of magnetic tunnel junction sensors 621, 623, 625.

The stacked magnetic memory structure of FIG. 6 can further include a fourth heater 650 formed adjacent to the fourth plurality of magnetic tunnel junctions 621, 623, 625. The fourth heater 650 provides thermal heat to the fourth plurality of magnetic tunnel junctions 621, 623, 625. Generally (but not required), the fourth heater 650 is thermally isolated from the third plurality of magnetic tunnel junctions 621, 623, 625. As described, heating the magnetic tunnel junctions 621, 623, 625 reduces the magnitude of the write current required to set magnetic orientations of the magnetic tunnel junctions 621, 623, 625.

The substrate 670 can include a third select transistor Q3, and a fourth select transistor Q4. When both the third select transistor Q3 and the fourth select transistor Q4 are turned on, current is conducted through the third heater 640 and the fourth heater 650. Generally, the third select transistor Q3 and the fourth select transistor are both selected when writing to at least one of the magnetic tunnel junctions 611, 613, 615 of the second group first layer 610, or of the magnetic tunnel junctions 621, 623, 625 of the second group second layer 620. The third heater 640 and the fourth heater 650 only need to be turned on when writing to a magnetic tunnel junction. Reading a magnetic tunnel junction does not require a heater to be turned on.

An embodiment includes the fourth select transistor Q4 controlling enabling of the third and fourth heaters 640, 650. A Heater Enable2 control is connected to the gate of the fourth select transistor Q4, and turns the fourth select transistor Q4 on when the heaters 640, 650 are to be turned on. The source of the fourth select transistor Q4 is connected to ground, and the drain of the fourth select transistor Q4 is connected to the fourth heater 650 through conductive lines.

An embodiment includes the third select transistor Q3 providing row selection and heater control. The Row Enable1 control is connected to the gate of the third select transistor Q3. A Vread sense or a VH (voltage for the heaters) is connected to the drain of the third select transistor (Q3). The source of the third select transistor Q3 is connected to the third heater 640. A circuit schematic will be described later to provide additional clarity of the electrical connection of the stacked magnetic tunnel junction structure.

Reading of at least one of the magnetic tunnel junctions 611, 613, 615 of the second group first 610, or of the magnetic tunnel junctions 621, 623, 625 of the second group second layer 620 only requires transistor Q3 to be selected. The selected transistor can be used to sense a resistive state of a magnetic tunnel junction located between one of the conductive select lines 612, 614, 616, 622, 624, 626 and the selected transistor. As previously described, the resistive state of each magnetic tunnel junction determines the logical state of the magnetic tunnel junction.

Conductive lines provide electrical connections between the third heater 640, the fourth heater 650 and the select transistors Q3, Q4.

This embodiment minimizes half-select errors because the magnetic tunnel junctions are divided up into groups of magnetic tunnel junctions. Only the magnetic tunnel junctions within a selected group are heated. As previously depicted, heating the magnetic tunnel junctions reduces the current required to cause the magnetic tunnel junction to change or flip magnetic orientations. Magnetic tunnel junctions with the selected groups are heated, and therefore, change states as a result of a lower magnitude write current. Magnetic tunnel junctions of un-selected groups of magnetic tunnel junctions retain a higher coercivity of the unheated state, and therefore, are less likely to change states due to half-selection errors.

For example, the first group of magnetic tunnel junctions 602 can be selected while the second group of magnetic tunnel junctions 604 are not selected. Therefore, the magnetic tunnel junction of the first group 602 are heated, while the magnetic tunnel junctions of the second group 604 are not heated.

The embodiment of FIG. 6 includes two groups of magnetic tunnel junctions 602, 604 that are oriented in an X direction according to an axis orientation designator 690. It is to be understood that multiple groups of magnetic tunnel junction can be formed in the X, Y and Z directions relative to the first group 602. Each of the groups can include a similar selection process.

Figure 7:
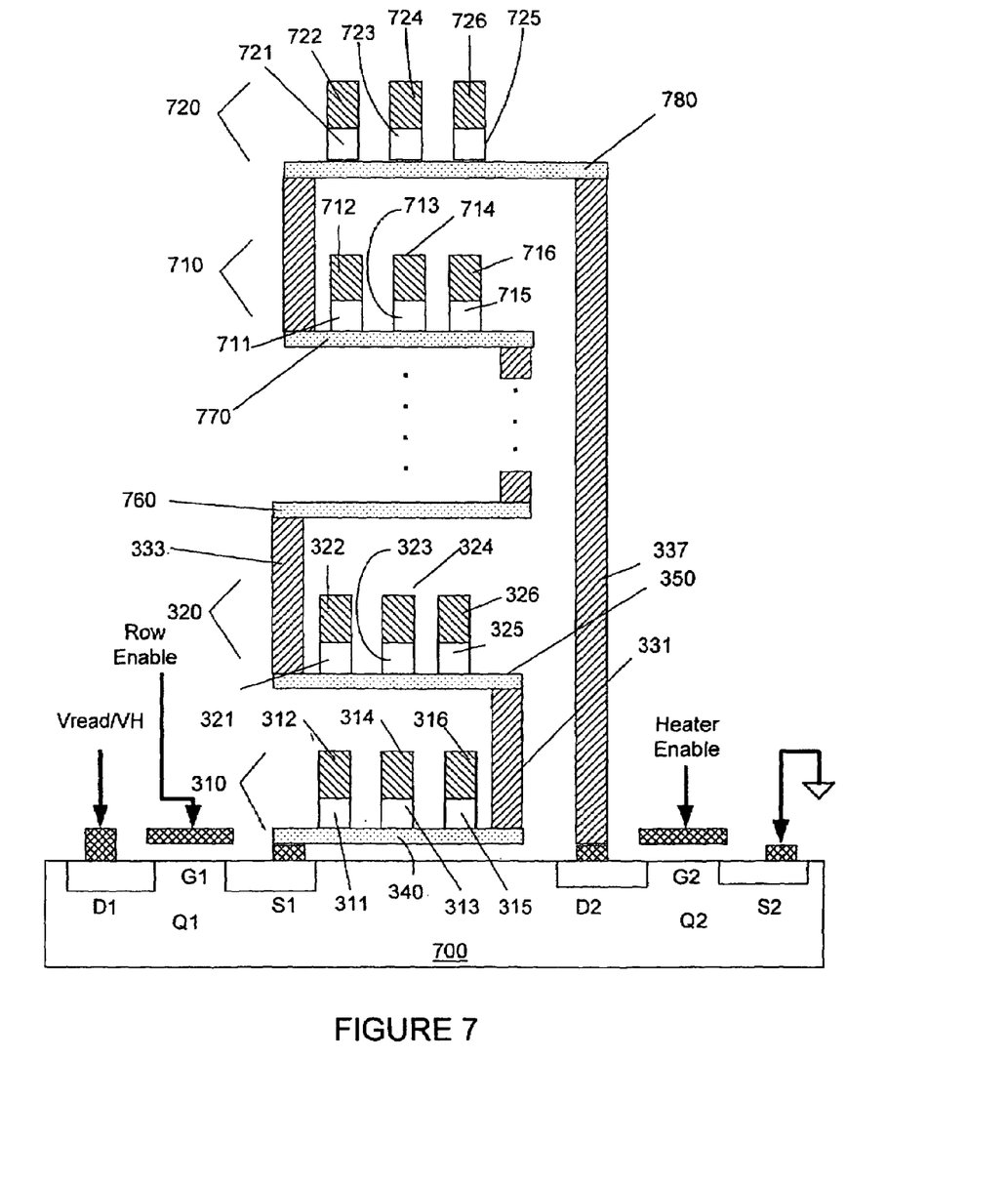
FIG. 7 shows a stacked memory structure according to another embodiment of the invention.

FIG. 7 shows a stacked memory structure according to another embodiment of the invention. This stacked memory structure includes an additional layers 710, 720. The additional layers 710, 720 provide for greater density of magnetic tunnel junctions. As shown, the stacked magnetic tunnel junction can include a large number of magnetic tunnel junction layers. In general, the layer 720 can be an Mth layer, and the layer 710 can be an (M-1)th layer. As shown, all of the layers of a group of magnetic tunnel junctions are simultaneously selected.

The Mth layer 720 of FIG. 7 includes additional magnetic tunnel junctions 721, 723, 725. The additional magnetic tunnel junctions are electrically connected to additional conductive select lines 722, 724, 726, and an additional heater 780. Similar to the embodiment of FIG. 3, the additional heater 760 is turned on when the first select transistor Q1 and the second select transistor Q2 are selected by the Heater Enable control and the Row Enable control.

The (M-1)th layer 710 of FIG. 7 includes additional magnetic tunnel junctions 711, 713, 715. The additional magnetic tunnel junctions are electrically connected to additional conductive select lines 712, 714, 716, and an additional heater 770. Similar to the embodiment of FIG. 3, the additional heater 770 is turned on when the first select transistor Q1 and the second select transistor Q2 are selected by the Heater Enable control and the Row Enable control.

Figure 8:
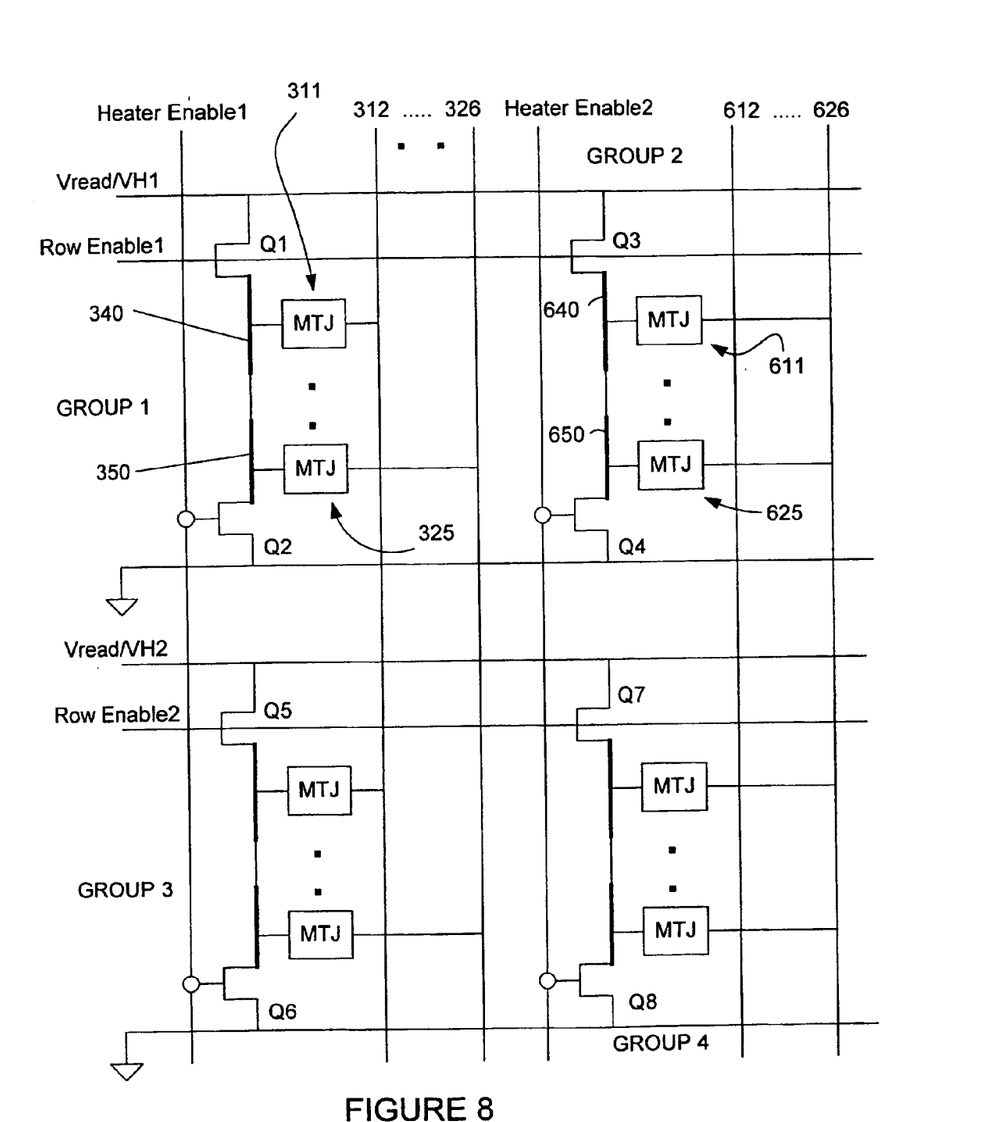
FIG. 8 is a schematic showing read/write circuitry of the magnetic tunnel junctions according to an embodiment of the invention.

FIG. 8 is a schematic showing read/write circuitry of the magnetic tunnel junctions according to an embodiment of the invention of FIG. 7, with the addition of a third group (GROUP 3) and a fourth group (GROUP 4). As described before, the invention can include any number of groups of magnetic tunnel junctions.

As shown in FIG. 8 and as previously described, the first group is selected by enabling the Row Enable1, Vread/VH1 and the Heater Enable1 lines. The second group is selected by enabling the Row Enable1, Vread/VH1 and the Heater Enable2 lines. The third group is selected by enabling the Row Enable2, Vread/VH2 and the Heater Enable1 lines. The fourth group is selected by enabling the Row Enable2, Vread/VH2 and the Heater Enable2 lines.

As shown in the schematic, the first group of magnetic tunnel junctions includes the selection transistors Q1, Q2, the heaters 340, 350 and magnetic tunnel junctions 311 to 325. The second group of magnetic tunnel junctions includes the selection transistors Q3, Q4, the heaters 640, 650 and magnetic tunnel junctions 611 to 625. The third and fourth groups include selection transistors Q5, Q6, Q7, Q8 as shown in FIG. 8. The third and fourth groups include corresponding magnetic tunnel junctions and heaters.

As described earlier, the Vread/VH1 control line is connected to the drain of the first select transistor Q1. The Row Enable1 control line is connected to the gate of the first select transistor Q1. Additionally, the Vread/VH1 control line is connected to the drain of a third select transistor Q3, and the Row Enable1 control line is connected to the gate of the third select transistor Q3.

As described earlier, the Heater Enable1 control line is connected to the gate of the transistor Q2. Additionally, the Heater Enable1 control line is connected to the gate of a transistor Q6.

As described earlier, the Heater Enable2 control line is connected to the gate of the transistor Q4. Additionally, the Heater Enable2 control line is connected to the gate of the transistor Q8.

The Vread/VH2 control line is connected to the drain of the fifth select transistor Q5. The Row Enable2 control line is connected to the gate of the fifth select transistor Q5. Additionally, the Vread/VH2 control line is connected to the drain of a seventh select transistor Q7, and the Row Enable2 control line is connected to the gate of the seventh select transistor Q7.

Figure 9:
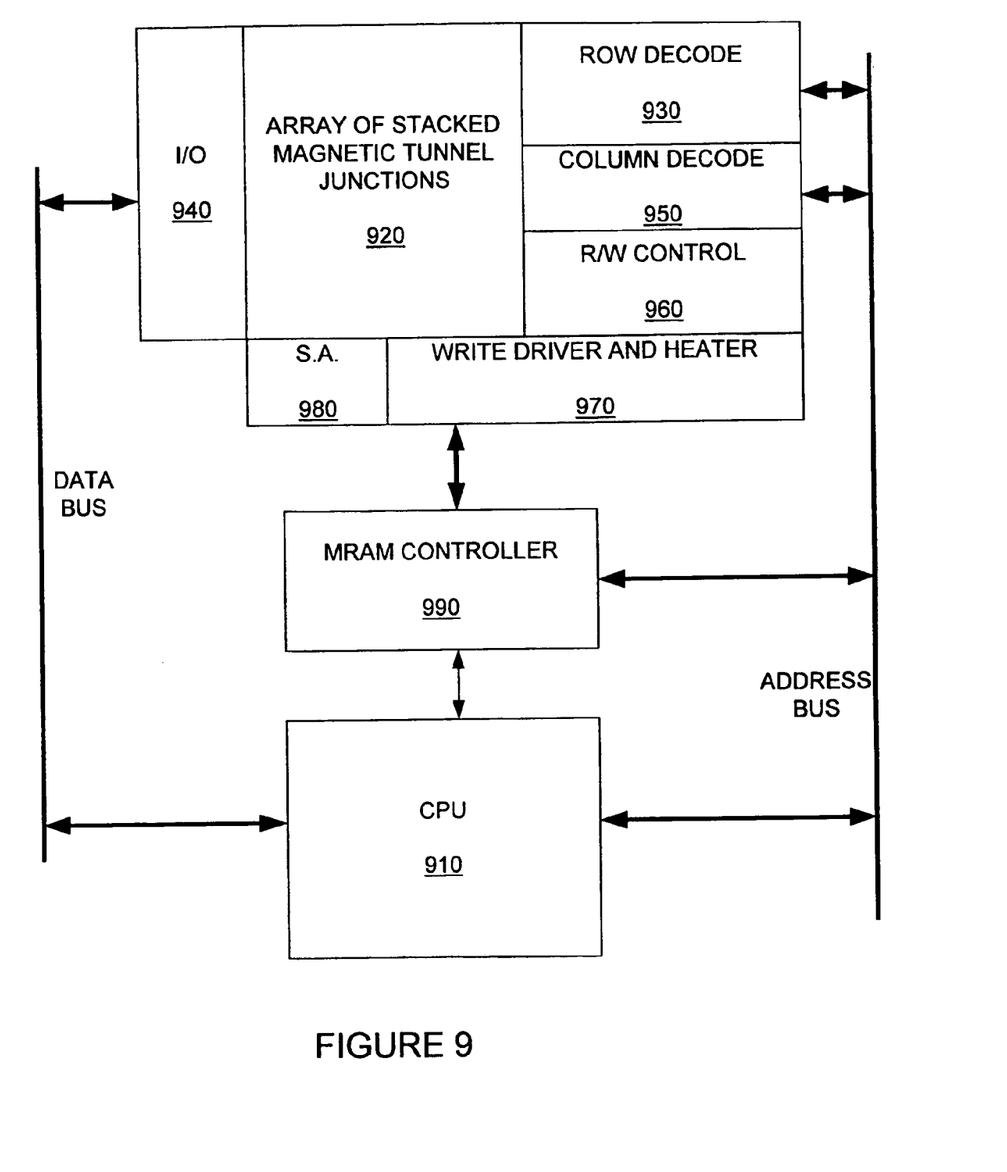
FIG. 9 is a computing system that includes magnetic tunnel junctions according to an embodiment of the invention.

FIG. 9 is a computing system that includes magnetic tunnel junctions according to an embodiment of the invention. The computing system includes a CPU (central processing unit) 910 that is interfaced with an array of magnetic tunnel junctions 920 according to embodiments of the invention.

Support circuitry can include address and data bus lines. A row decoder 930 selects row of the array 920. A column decoder 950 selects columns of the array 920. A R/W controller provides reading and writing controls. A write drive and heater controller 970 provides control over writing and heating of the array 920. Sense amplifier 980 provide for sensing states of magnetic tunnel junctions within the array 920. An I/O controller 940 provide input/output controls of the array 920. An MRAM controller can provides overall control of the array 920.

Figure 10A:
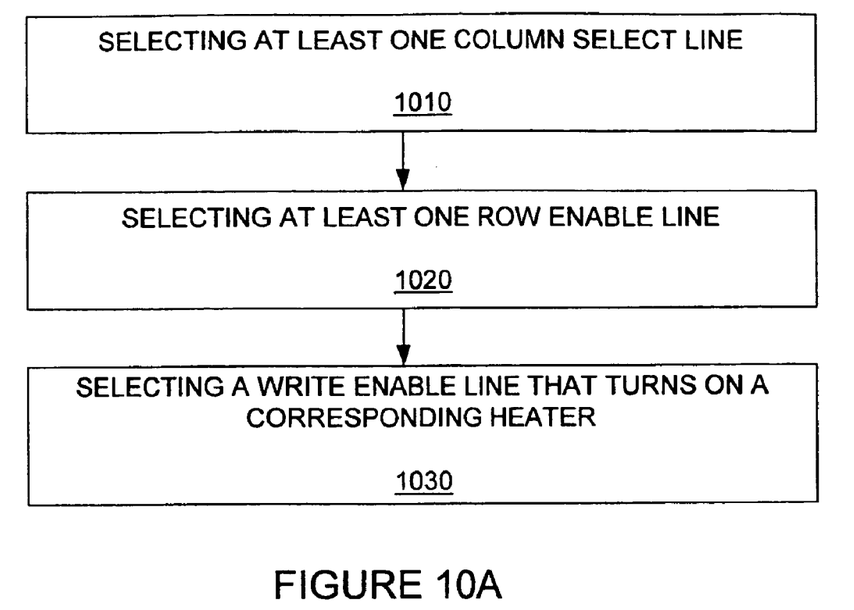
FIG. 10A and 10B are flow charts showing a method of accessing an array of stacked magnetic junction according to an embodiment of the invention.
Figure 10B:
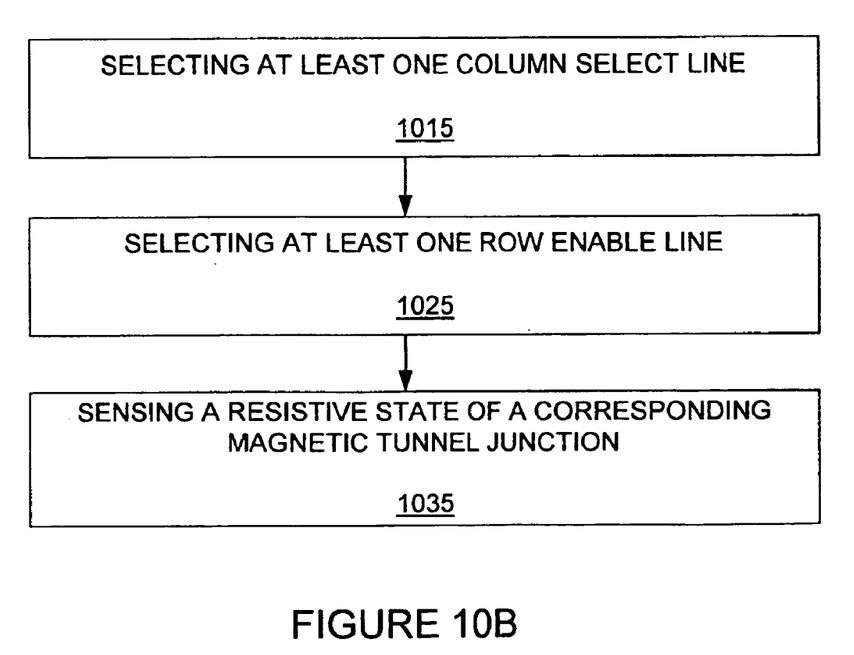

FIG. 10A and 10B are flow charts showing a method of accessing an array of stacked magnetic junction according to an embodiment of the invention.

The flow chart of FIG. 10A shows steps of writing to a stacked magnetic tunnel junction memory according to an embodiment of the invention.

A first step 1010 includes selecting at least one column select line.

A second step 1020 includes selecting at least one row enable line.

A third step 1030 includes selecting a write enable line that turns on a corresponding heater.

The flow chart of FIG. 10B shows steps of reading from a stacked magnetic tunnel junction memory according to an embodiment of the invention.

A first step 1015 includes selecting at least one column select line.

A second step 1025 includes selecting at least one row enable line.

A third step 1035 includes sensing a resistive state of a corresponding magnetic tunnel junction.

Although specific embodiments of the invention have been described and illustrated, the invention is not to be limited to the specific forms or arrangements of parts so described and illustrated. The invention is limited only by the appended claims.

What is claimed:

1. A computing system comprising:
   a central processing unit;
   a memory array electronically connected to the central processing unit;
   the memory array comprising a magnetic memory structure;
   the magnetic memory structure comprising:
   a first group of magnetic tunnel junctions, the first group comprising:
   a first layer formed adjacent to a substrate, the first layer comprising a first plurality of magnetic tunnel junctions;
   a second layer formed adjacent to the first layer, the second layer comprising a second plurality of magnetic tunnel junctions;
   a first heater formed adjacent to at least one of the first plurality of magnetic tunnel junctions and the second plurality of magnetic tunnel junctions, the first heater providing thermal heat to the at least one of the first plurality of magnetic tunnel junctions and the second plurality of magnetic tunnel junctions, the first heater being formed by a common first group conductor comprising first heat regions proximate to at least one of the first plurality of magnetic tunnel junctions and the second plurality of magnetic tunnel junctions;
   wherein
   current conducted through the common first group conductor can be used to aid both writing and heating of more than one of the first magnetic tunnel junctions;
   a second group of magnetic tunnel junctions, the second group comprising:
   a second group first layer formed adjacent to the substrate, the second group first comprising a third plurality of magnetic tunnel junctions;
   a second group second layer formed adjacent to the second group first layer, the second group second layer comprising a fourth plurality of magnetic tunnel junctions;
   a third heater formed adjacent to at least one of the third plurality of magnetic tunnel junctions and the fourth plurality of magnetic tunnel junctions, the third heater providing thermal heat to the at least one of the third plurality of magnetic tunnel junctions and the fourth plurality of magnetic tunnel junctions,
   wherein the first heater is turned on if the first and second pluralities of magnetic tunnel junctions are selected, and the third heater is turned on if the third and fourth magnetic tunnel junctions are selected.

2. The computing system of claim 1, further comprising:
   a second heater formed adjacent to an other of the first plurality of magnetic tunnel junctions and the second plurality of magnetic tunnel junctions, the second heater providing thermal heat to the other of the first plurality of magnetic tunnel junctions and the second plurality of magnetic tunnel junctions.

3. The computing system of claim 1, wherein a heater of a group is turned on only when the group is selecting for writing.

4. The computing system of claim 1, wherein active devices that control selection of the magnetic tunnel junction are formed on a substrate associated with the magnetic memory structure.

5. The computing system of claim 1, wherein active devices that control sensing of magnetic states of the magnetic tunnel junction are formed in the substrate.

6. The computing system of claim 1, wherein less write current is required to write to a selected group of magnetic tunnel junctions than to a non-selected group.

7. The computing system of claim 1, wherein less write current is required to write to the first, second, third and fourth magnetic tunnel junctions if a corresponding heater is turned on than if the corresponding heater is turned off.

8. The computing system of claim 1, further comprising first select lines, second select lines and third select lines, the first select lines selecting individual magnetic tunnel junctions, the second select lines and third select lines selecting the first and second pluralities of magnetic tunnel junctions.

9. The computing system of claim 8, wherein a first select line, a second select line and a third select line must be selected to write to a magnetic tunnel junction.

10. The computing system of claim 8, wherein only a first select line and a second select line must be selected to read from a magnetic tunnel junction.

11. The computing system of claim 8, wherein the first select lines are column select lines, the second select lines are row enable lines and the third select lines are write enable lines.

12. The computing system of claim 1, wherein the third heater is formed from at least one of tungsten and platinum.

* * * * *